US 9,279,864 B2

(12) United States Patent
Ausserlechner

(10) Patent No.: US 9,279,864 B2
(45) Date of Patent: Mar. 8, 2016

(54) SENSOR DEVICE AND SENSOR ARRANGEMENT

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 113 days.

(21) Appl. No.: 14/279,509

(22) Filed: May 16, 2014

(65) Prior Publication Data

US 2015/0331067 A1 Nov. 19, 2015

(51) Int. Cl.
*G01R 33/07* (2006.01)
*G01D 5/14* (2006.01)
*H01L 43/14* (2006.01)

(52) U.S. Cl.
CPC ............ *G01R 33/077* (2013.01); *G01R 33/07* (2013.01); *G01D 5/145* (2013.01); *H01L 43/14* (2013.01)

(58) Field of Classification Search
CPC ...... G01R 33/07; G01R 33/077; H01L 43/14; G01D 5/145
USPC .............................................. 324/251, 207.2
See application file for complete search history.

(56) References Cited

U.S. PATENT DOCUMENTS

| | | | | |
|---|---|---|---|---|
| 5,572,058 | A * | 11/1996 | Biard | H01L 27/22 257/421 |
| 7,782,050 | B2 | 8/2010 | Ausserlechner | |
| 2013/0342195 | A1 * | 12/2013 | Ausserlechner | H01L 43/065 324/251 |

FOREIGN PATENT DOCUMENTS

| | | |
|---|---|---|
| DE | 102009015965 A1 | 10/2009 |
| DE | 102011107767 A1 | 1/2013 |
| DE | 102012212594.9 | 11/2013 |
| EP | 1438755 | 7/2004 |

OTHER PUBLICATIONS

Maenaka, K.et al., *Novel Vertical Hall Cells in Standard Bipolar Technology*, Electronic Letters, Oct. 8, 1997, vol. 23, No. 21, pp. 1104-1105.
Maenaka, K., *Piezoresistive Effect in Vertical Hall Cell*, Electronics Letters, Feb. 18, 1993 vol. 29 No. 4., pp. 381-382.
Maenaka, Kazusuke, *Monolithic Integrated Magnetic Sensor Realizing Omnidirectional Measurement*, Electronics and Communications in Japan, Part 2, vol. 75, No. 3, pp. 65-75, 1992.

* cited by examiner

*Primary Examiner* — Reena Aurora
(74) *Attorney, Agent, or Firm* — Eschweiler & Associates, LLC

(57) ABSTRACT

A vertical Hall sensor structure according to an embodiment includes a Hall effect region arranged between a first interface and a second interface of the Hall effect region, a first contact, a second contact, a third contact, and a fourth contact, the first, second, third and fourth contacts being closer to the first interface than to the second interface and in contact with the Hall effect region, wherein an electrical resistance between the first and second contacts is substantially equal to an electrical resistance between the third and second contacts, a conductive layer closer to the second interface than to the first interface and in contact with the Hall effect region, the conductive layer comprising a higher conductivity than the Hall effect region, wherein a resistance between the fourth contact and the conductive layer is lower than a resistance between the second contact and the conductive layer.

20 Claims, 11 Drawing Sheets

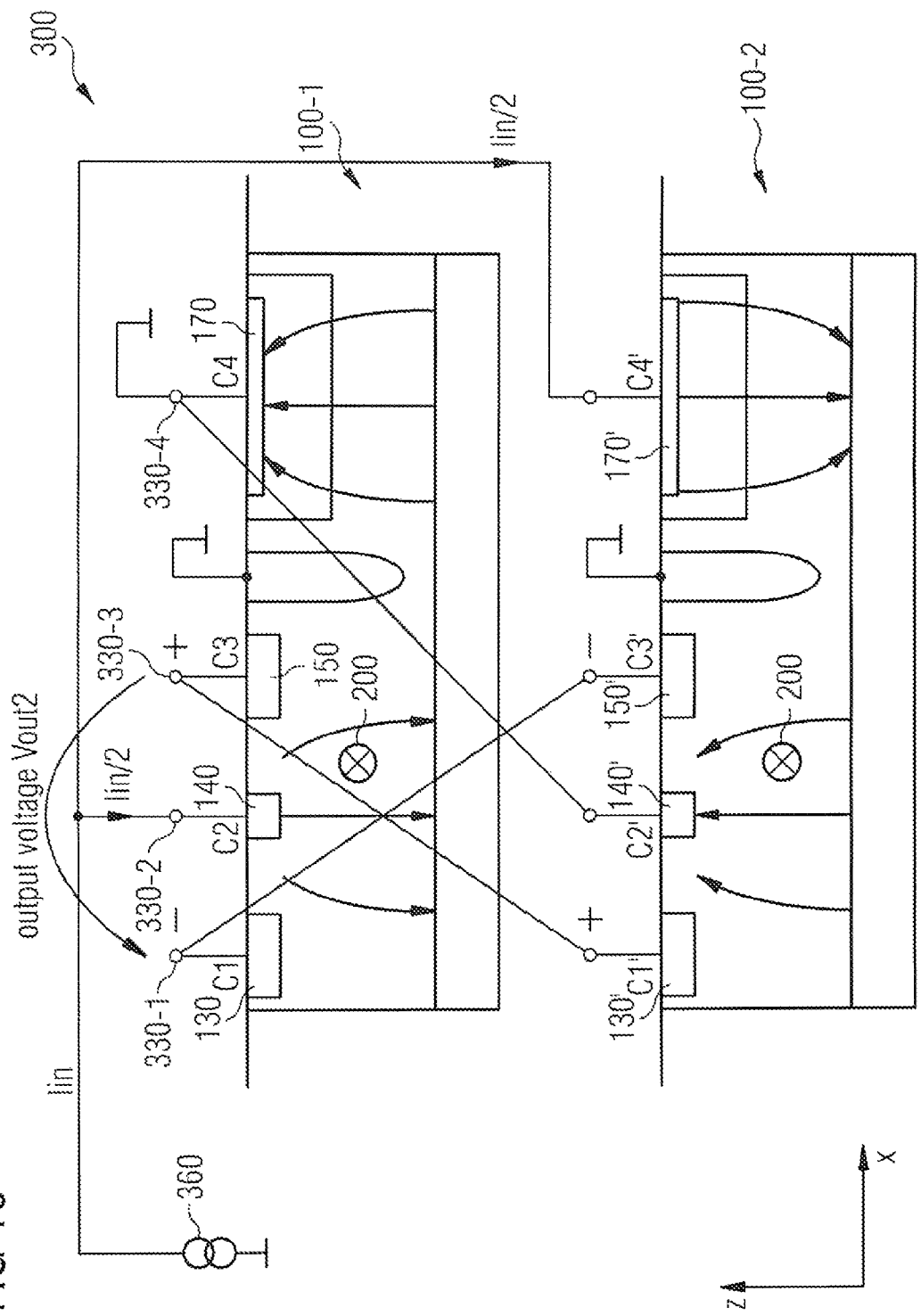

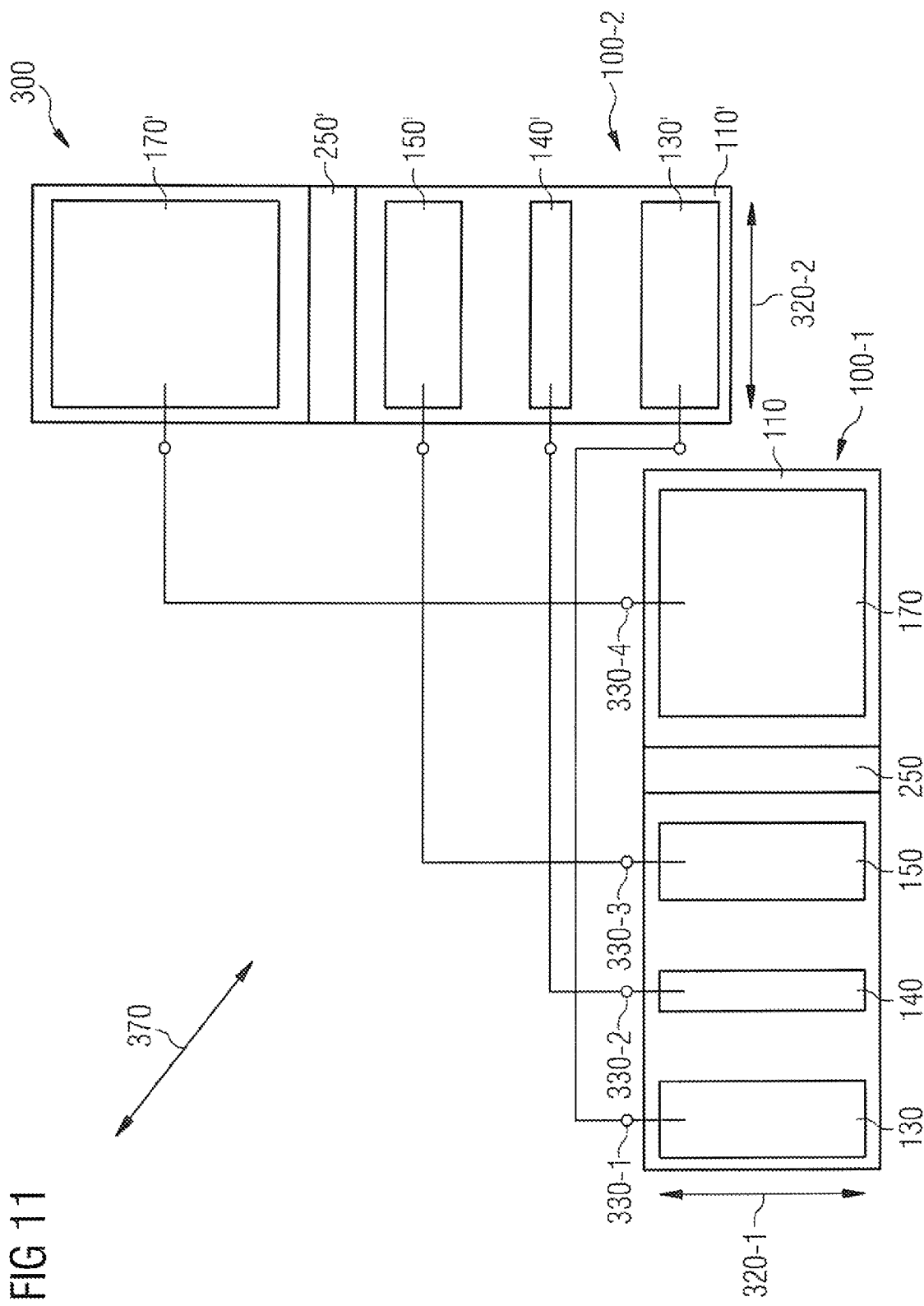

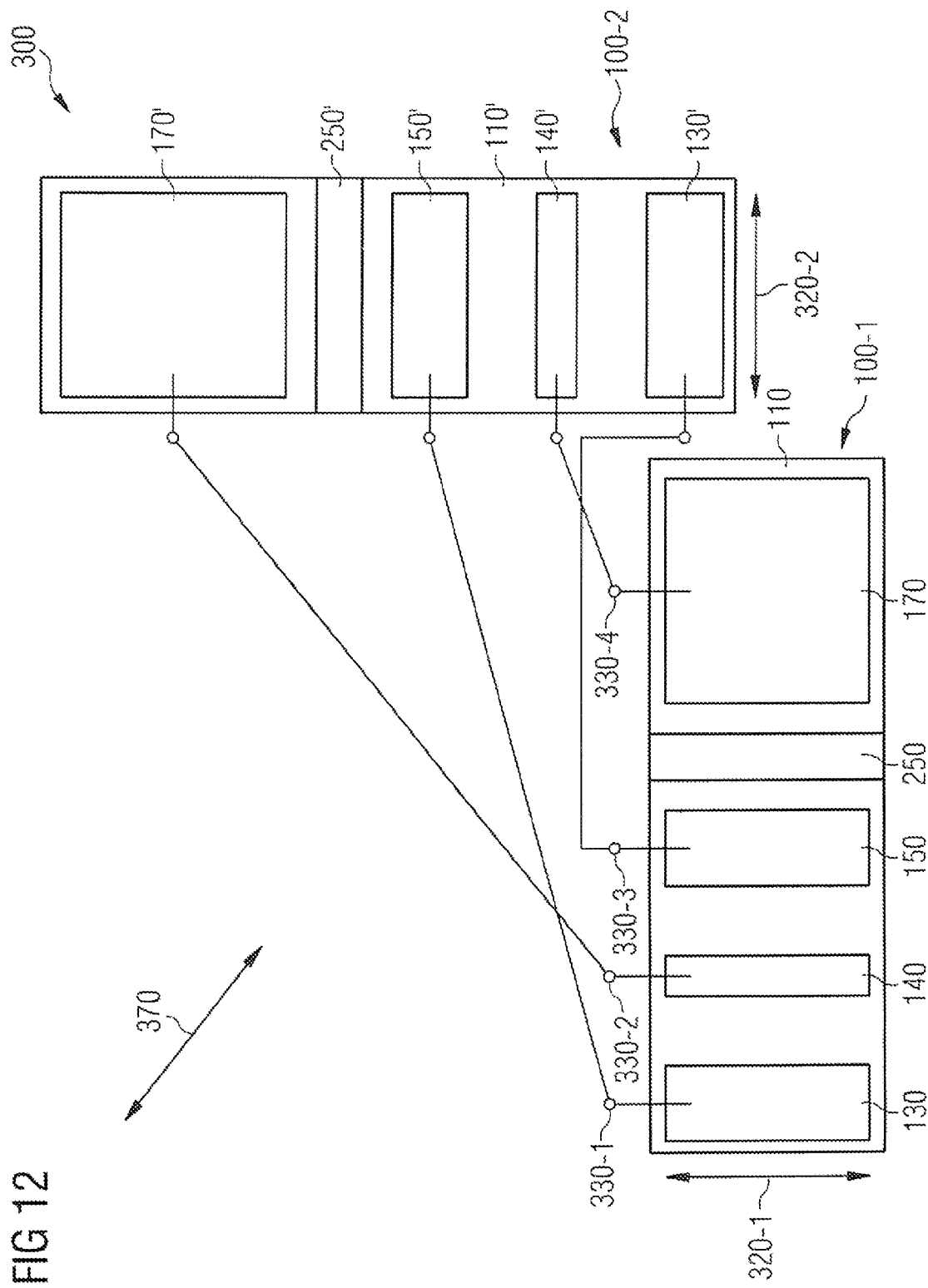

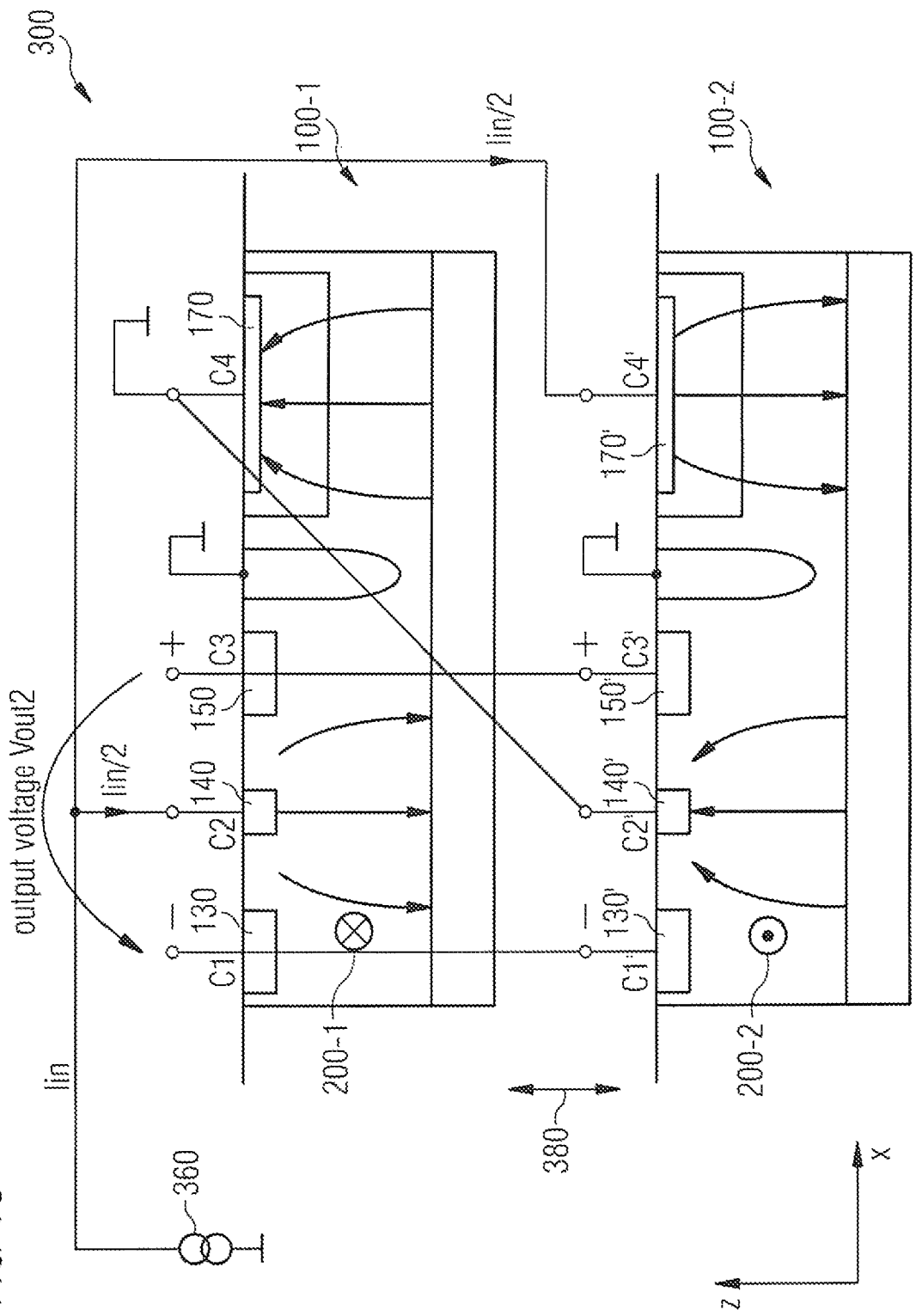

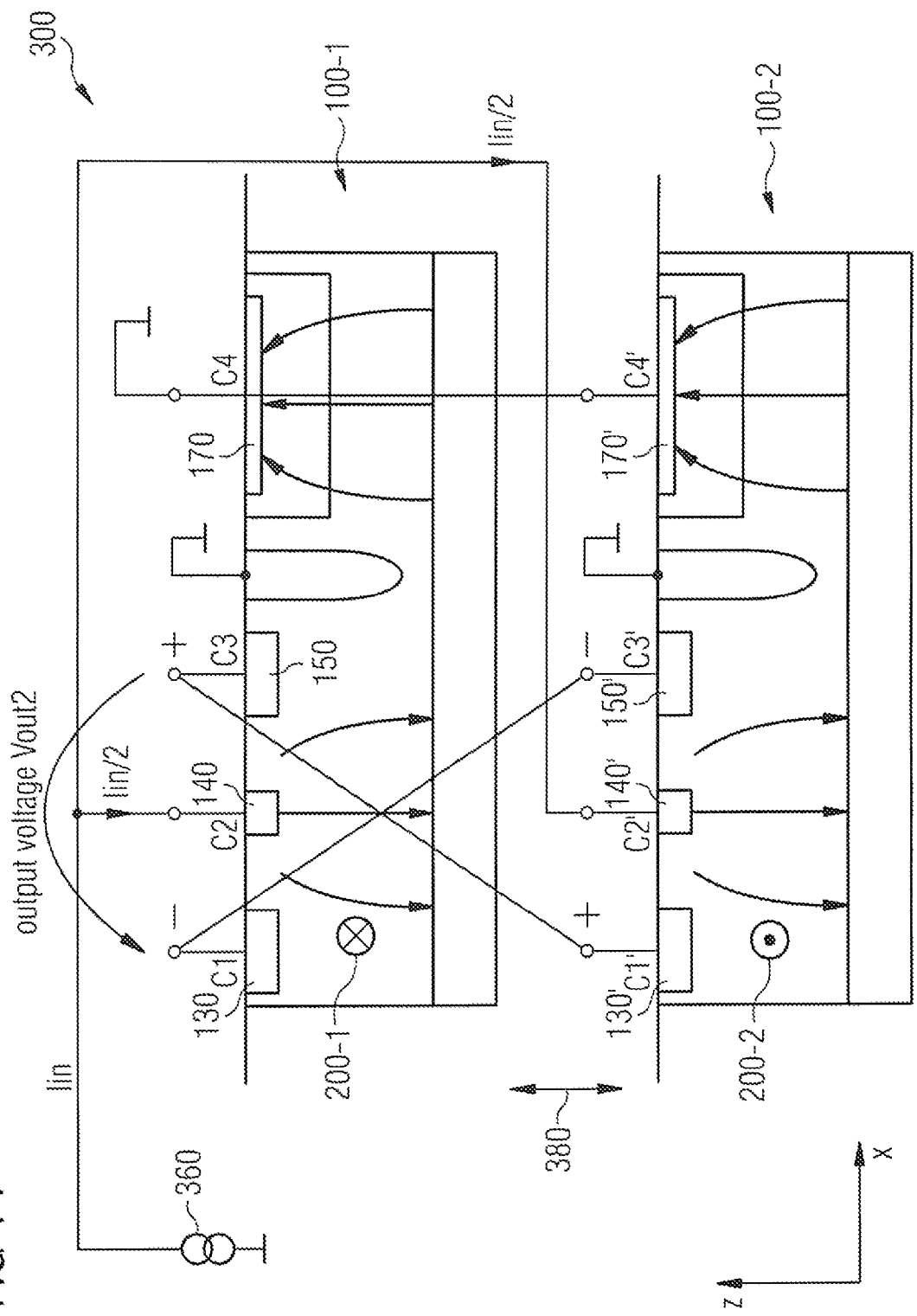

SENSOR DEVICE AND SENSOR ARRANGEMENT

FIELD

Embodiments relate to a vertical Hall sensor structure, a vertical Hall sensor device and a method.

BACKGROUND

In many applications, components and systems, magnetic fields are used for different purposes. For instance, magnetic fields can be used to store information, to transmit information, to manipulate components, to detect a position or an orientation of an object and other purposes to name just a few. To detect the magnetic field appropriate magnetic sensor structures may be used. Among those magnetic sensor structures Hall sensor structures represent a sensor structure, which may offer the possibility of an easy implementation into an integrated circuit since the fabrication processes to produce a Hall sensor structure may be similar and are often compatible with fabrication processes used to fabricate an integrated structure integrated into a die or substrate.

Hall sensor structures employ the Hall effect, which is based on the fact that due to the Lorentz force, moving charge carriers experience a force, when they move in a magnetic field. The force is directed perpendicular to the direction of motion of the charge carriers. This force may give rise to an electric field which may then be detected, for instance, in the form of a voltage. Lateral Hall sensor structures are typically implemented in a die or substrate and are responsive to magnetic field components perpendicular to a main surface of the die or substrate. Vertical Hall sensor structures may be sensitive to a magnetic field component parallel to the main surface of a corresponding die or substrate.

Unfortunately, in many cases vertical Hall sensor structures are comparably asymmetric with respect to their transport properties and, hence, with respect to their sensing or detecting quality. They may, for instance, show variations of the internal resistances, which in turn may be caused by a geometry, fabricational parameters and other reasons, to name just some possible effects and reasons.

SUMMARY

Therefore, a demand exists to provide a vertical Hall sensor structure having a more symmetric sensing and detecting behavior.

The vertical Hall sensor structure according to an embodiment comprises a Hall effect region arranged between a first interface and a second interface of the Hall effect region, a first contact, a second contact, a third contact, and a fourth contact, the first, second, third and fourth contacts being closer to the first interface than to the second interface and in contact with the Hall effect region, wherein an electrical resistance between the first and second contacts is substantially equal to an electrical resistance between the third and second contacts, a conductive layer closer to the second interface than to the first interface and in contact with the Hall effect region, the conductive layer comprising a higher conductivity than the Hall effect region, wherein a resistance between the fourth contact and the conductive layer is lower than a resistance between the second contact and the conductive layer.

A method according to an embodiment comprises providing electrical energy to a vertical Hall sensor structure in a first phase of operation by a first pair of contacts of the vertical Hall sensor structure, wherein the first pair of contacts comprises the first contact and the third contact, sensing a first magnetic-field sensitive signal at a second pair of contacts during the first phase of operation, wherein the second pair of contacts comprises the second contact and the fourth contact, providing electrical energy to the vertical Hall sensor structure in a second phase of operation by the second pair of contacts of the vertical Hall sensor structure, and sensing a second magnetic-field sensitive signal at the first pair of contacts during the second phase of operation.

BRIEF DESCRIPTION OF THE DRAWINGS

Several embodiments of the present invention will be described in the enclosed Figures.

FIG. 10 shows a schematic cross-sectional view of a vertical Hall sensor device according to an embodiment comprising two vertical Hall sensor structures;

FIG. 11 shows a schematic plan view of a vertical Hall sensor device according to an embodiment in a first contact arrangement;

FIG. 12 shows a schematic plan view of a vertical Hall sensor device according to an embodiment in a second contact arrangement;

FIG. 13 shows a schematic cross-sectional view of a vertical Hall sensor device according to an embodiment comprising two vertical Hall sensor structures for a magnetic field with opposite directions acting on the two vertical Hall sensor structures; and FIG. 14 shows a schematic cross-sectional view of a vertical Hall sensor device according to an embodiment comprising two vertical Hall sensor structures for a magnetic field with opposite directions acting on the two vertical Hall sensor structures.

DETAILED DESCRIPTION

Figure 1:
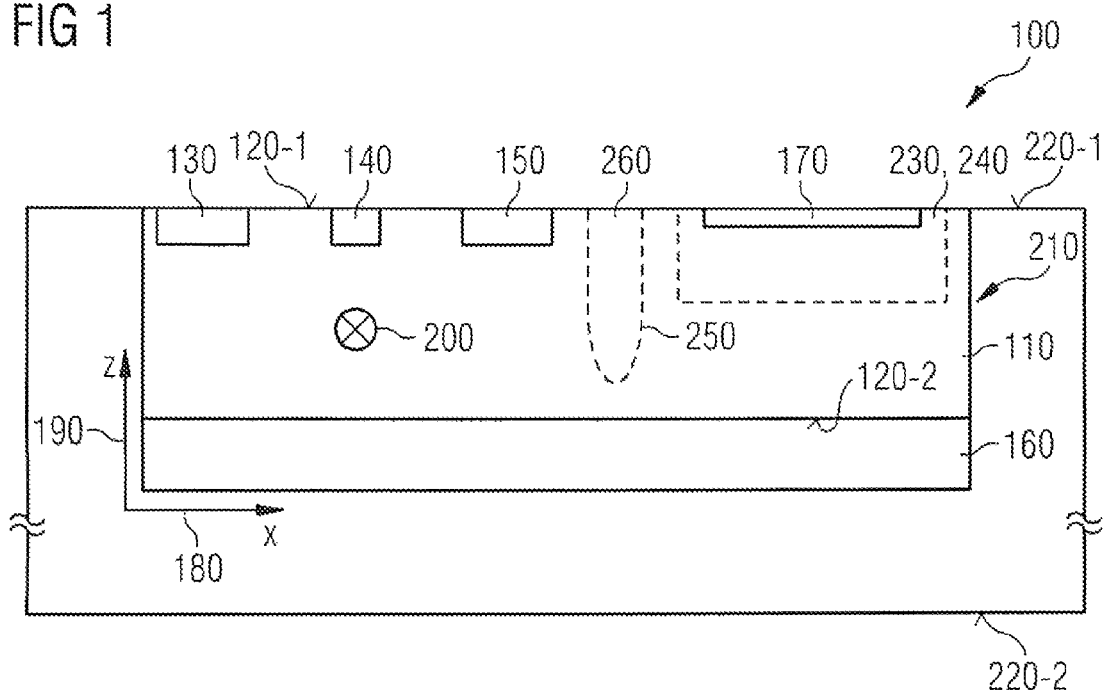
FIG. 1 shows a cross-sectional view of a vertical Hall sensor structure according to an embodiment.

In the following, embodiments will be described in more detail. In this context, summarizing reference signs will be used to describe several objects simultaneously or to describe common features, dimensions, characteristics, or the like of these objects. The summarizing reference signs are based on their individual reference signs. Moreover, objects appearing in several embodiments or several figures, but which are identical or at least similar in terms of at least some of their functions or structural features, will be denoted with the same or similar reference signs. To avoid unnecessary repetitions, parts of the description referring to such objects also relate to the corresponding objects of the different embodiments or the different figures, unless explicitly or—taking the context of the description and the figures into account—implicitly stated otherwise. Therefore, similar or related objects may be implemented with at least some identical or similar features, dimensions, and characteristics, but may be also implemented with differing properties.

As will be laid out in more detail below, embodiments relate to vertical Hall sensor structures, vertical Hall effect devices and devices comprising, for instance, a vertical Hall sensor structure as well as a corresponding method. Hall effect structures and devices comprise one or more Hall effect regions. In the Hall effect region, the Lorentz force caused by the magnetic field acts on the moving charge carriers, which may give rise to a Hall electric field.

The moving charge carriers may, for instance, be supplied by an electric power source connected to the supply terminals of the Hall-effect device. At the signal terminals, the output signal or output signals of the Hall effect device can be tapped. The terminals of the device are connected or coupled to contacts of the Hall-effect structure. All contacts may, for instance, be Ohmic contacts, as a consequence of which a Hall effect device may be considered as a purely resistive device.

The contacts may be fabricated using one or more fabrication processes including, for instance, diffusion (contact diffusion) or implantation (contact implantation). The contacts may be implemented as shallow wells of the same conductivity type as the Hall region, which may also be implemented as a well. The well of the Hall region may be realized as a lower doped well with a doping concentration, for instance, in the range of approximately $10^{15}/cm^3$ to $10^{17}/cm^3$. In contrast, the wells of the contacts may comprise doping concentrations of $10^{18}/cm^3$ or more.

A tungsten (W) plug may be implemented above—for instance, in direct contact with—the contact tubs, which couples the corresponding contact to a wire or line. The line may be implemented in an interconnect layer fabricated from or comprising a metallic material such as aluminum (Al) or copper (Cu) or poly-crystalline silicon. The line may comprise a lower resistance than the Hall region, for instance, at least 30-times lower than internal resistance of the Hall-effect structure.

In Ohmic contacts, lines, wires or other structures, the amount of current flowing in one direction typically changes at most by approximately 20%, when the polarity of a voltage of, for instance, several ten to some hundred millivolts is changed. In such an Ohmic structure, the amount of current flowing in one direction might change by not more than the previously mentioned 20%, when the voltage applied is about 1V and its polarity is changed. However, it should be noted that a wire or a line is by far not restricted to couple only two ports, contacts, terminals or the like. It may interconnect more than two ports, contacts, terminals or the like. Moreover its shape may be linear (i.e. essentially one-dimensional) but it may also have the shape of an area with similar extensions in two dimensions.

Vertical Hall effect structures and devices are structures and devices, respectively, which respond to a magnetic field component parallel to a main surface of a die or a substrate, in which the corresponding structure or device is implemented. As will be laid out in more detail below, Hall effect structures or devices may be fabricated using thin film and semiconductor fabrication processes such as patterning, etching, implanting, thermal treatment, annealing and other processes.

The die of a substrate comprising the vertical Hall sensor structure may, for instance, be substantially plate-like shaped extending along three linearly independent directions, which are also referred to as first, second and third directions or x-, y- and z-directions, respectively. An extension along the third direction is typically substantially smaller than the extensions along the other two directions (first and second directions). For instance, the extension of the substrate or die along the third direction, which is also referred to as the z-direction, may be at least 5-times, at least 10-times or at least 20-times smaller than the shortest extension along any of the other two directions (first direction or x-direction and second direction or y-direction).

Hall effect structures and devices may be divided roughly into lateral Hall effect structures and devices and vertical Hall effect structures and devices. Lateral Hall effect structures and devices are typically responsive to magnetic fields or magnetic field components acting in a direction perpendicular to a main surface of the die or substrate which may, for instance, be parallel to the first and second directions (x-direction and y-direction) mentioned before. In other words, the first and second directions may be oriented along the main surface of the die or substrate. Typically, the die or substrate comprises a first main surface and a second main substrate arranged on the opposite side of the first main surface. Due to the previously-described relations with respect to the extensions along the three directions, the main surfaces of the die or substrate are typically significantly larger than the other surfaces of a die or substrate.

In contrast to the lateral Hall effect structures and devices, vertical Hall effect structures and devices, which may also be referred to as vertical Hall sensor structures, may be responsive to magnetic fields or magnetic field components parallel to the main surface of the die or substrate. Since many of the thin film and semiconductor fabrication processes are applied from the first main surface of the die or substrate, vertical Hall effect devices and structures may be asymmetric in a way that permutations of the contacts may lead to different electrical properties, like internal resistances and similar effects. Depending on the application in mind, this may be less favorable. Therefore, a demand exists to find a vertical Hall sensor structure with a higher symmetry and a higher magnetic sensitivity, which is less sensitive to or more independent of changes with respect to different electrical contacts.

FIG. 1 shows a schematic cross-sectional view of a vertical Hall sensor structure 100 according to an embodiment. The vertical Hall sensor structure 100 comprises a Hall effect region 110 arranged between a first interface 120-1 and a second interface 120-2. The first interface 120-1 may be essentially parallel to the main surfaces of the die or substrate. For instance, the first interface 120-1 may be closer to an interconnect layer of a Hall-effect sensor device than the second interface 120-2. For instance, a structure being above another structure may be closer to the first interface 120-1 than to the second interface 120-2.

The vertical Hall sensor structure 110 further comprises a first contact 130, a second contact 140 and a third contact 150. These contacts 130, 140, 150 are closer to the first interface 120-1 than to the second 120-2. They are, however, also in contact with the Hall effect region 110. An electrical resistance or—in short—resistance between the first and second contacts 130, 140 is substantially equal to a resistance between the third and second contacts 150, 140. Moreover, the vertical Hall sensor structure 100 comprises a conductive layer 160, which is closer to the second interface 120-2 than to the first 120-1. The conductive layer 160 comprises a higher conductivity than the Hall effect region 110. Its conductivity may be at least 20-times higher than the conductivity of the Hall region 110, but of the same conductivity type. This conductivity difference may be advisable to form an Ohmic contact between the layer 160 and the Hall region 110 and to prevent a Schottky- or Schottky-like contact.

For instance, the conductive layer 160 may be formed as a buried layer. However, the layer 160 may be implemented differently, for instance having a backside being accessible due to a backside etching process. To name just one example, the layer 160 may be accessible via the second main surface. It may be fabricated based on a layer grown during a corresponding process to form an epitactical or a polymorphous layer, based on an implantation or any other fabrication technique including, for instance, a combination of any of these processes. The layer 160 is, however, typically arranged on the opposite side of the Hall region 110 than the contacts 130, 140, 150. For instance, the second interface 120-2 of the Hall region 110 may be in contact with the layer 160.

Furthermore, the vertical Hall sensor structure 100 also comprises a fourth contact 170, which is also closer to the first interface 120-1 than to the second interface 120-2. It is designed and implemented so that a resistance between the fourth contact 170 and the conductive layer 160 is lower than a resistance between the second contact 140 and the conductive layer 160.

Due to the implementation of the fourth contact 170 as described, the asymmetry of the vertical Hall sensor structure 100 may be less pronounced compared to other vertical Hall sensor devices. Due to the implementation of the fourth contact 170, the layer 160 may be electrically coupled with a lower resistance or electrical resistance.

The layer 160 may extend along a direction 180, which may be the first direction or x-direction, underneath the first, second and third contacts 130, 140, 150 such that depending on the function the previously-mentioned contacts 130, 140, 150 take over during operation, a current may flow, for instance, substantially along the third direction 190 (z-direction). For instance, the third direction 190 may be perpendicular to the direction 180 as, for instance, depicted in FIG. 1.

Due to the fourth contact 170 being implemented in the described way, the Lorentz force caused by a magnetic field 200 acting along the second direction perpendicular to both directions 180, 190 shown in FIG. 1) may cause a Hall-electric field along the third direction.

The vertical Hall sensor structure 100 as, for instance, depicted in FIG. 1, may be considered as a 4T-V Hall-device with a layer 160 and a high magnetic sensitivity. The term "4T" is an abbreviation for a four-terminal structure or device. It should be noted that in the previous discussion and the following description, contacts will be distinguished from terminals. A contact may be considered a diffusion or implantation region provided into the Hall effect region 110, its substrate or another semiconductor region. In other words, a contact such as the first, second, third and fourth contacts 130, 140, 150, 170, may be implemented as a well or a tub, for instance in the Hall effect region 110. The wells forming the contacts in the Hall effect region 110 may be of the same conductivity type, for instance an n-conductivity type. Naturally, in other embodiments also p-type contacts or wells or a combination of both may be used, for instance when the substrate or the semiconductor region into which the Hall effect region 110 is implemented is a p-type semiconductor.

Conversely, the terminal may be considered a port which can be connected to another circuit or circuitry and which may be implemented differently from a tub or a well in the surface or interface 120-1 of the Hall effect region 110. A terminal may, for instance, comprise a second end of a wire, conductive structure or the like, the first end of which may, for instance, be immediately connected to another contact. A wire may, for instance, be fabricated in an interconnect layer such as a metal layer, which may also be referred to as metal 1-layer or metal 2-layer in more complex devices such as CMOS (Complementary Metal Oxide Semiconductor) or BiCMOS (Bipolar CMOS) devices and silicon technologies. However, it may also be implemented in any other low Ohmic structure comprising, for instance, a highly-doped poly-silicon (poly Si) or the like. For instance, a terminal may further comprise a tungsten (W) plug between the contact or contact diffusion area and the previously-explained wire or wire-like structure. In this case, anything below the tungsten plug in the bulk of the substrate or die (bulk silicon) may be considered to be part of the contacts, whereas anything above the lowest tungsten plug may, for instance, be considered to be part of all the wire belonging to the terminal.

For instance, several contacts can be shorted to a single terminal. However, in the embodiment depicted in FIG. 1, each contact 130, 140, 150, 170 may be coupled to an individual terminal such that no two contacts 130, 140, 150, 170 are shorted. In other words, the contact 130, 140, 150 and 170 may, for instance comprise a diffusion region or well. For instance, the fourth contact 170 may be significantly larger than any of the other contacts 130, 140, 150. It may be implemented as an n-doped region. This may be one way to implement the fourth contact 170 having a resistance with respect to the layer 160, which is smaller than, for instance, the resistance of a sensor or third contact 150 arranged, for instance, in the left n-doped region shown in FIG. 1.

The vertical Hall sensor structure 100 may, for instance, be formed in and/or on a substrate 210 having a first main surface 220-1 and a second main surface 220-2. The Hall effect region 110 may in this case be arranged between the first and second main surfaces 220-1, 220-2, wherein the first main surface 220-1 may be closer to the first and second interfaces 120-1, 120-2 than the second main surface 220-2. In other words, the vertical Hall sensor structure 100 may be formed in a region closer to the first main surface 220-1. This may allow a more easy fabrication.

Optionally, the first contact 130 and the third contact 150 may be substantially equally spaced from the second contact 140. In other words, the first and third contacts 130, 150 may be arranged symmetrically with respect to the second contact 140 along the direction 180.

To implement the substantially equal resistances with respect to the first and second contacts 130, 140 and the third and second contacts 150, 140, a contact area of the first contact 130 on the first interface 120-1 and the contact area of the third contact 150 on the first interface 120-1 may be implemented to be substantially equal in size and optionally in shape. Along with the previously-described arrangement of the first and second contacts 130, 150 with respect to the second contact 140, this may further generate a more equal electrical resistance as described before. Additionally or alternatively, the material of the first contact 130 and the material of the third contact 150 may also be substantially identical. For instance, all contacts 130, 140, 150, 170 along with the Hall effect region 110 and the conductive layer 160 may be of the same conductivity type, such as of the n-type or of the p-type. As a material for these structures a semiconducting material may be used such as silicon (Si). For instance, n-doped monocrystalline silicon may be used as die material or as a material for at least one, some or all contacts 130, 140, 150, 170, the Hall effect region 110 and/or the conductive layer 160.

Optionally, a resistance between the first contact 130 and the fourth contact 170 may be substantially equal to a resistance between the third contact 150 and the fourth contact 170. Additionally or alternatively, the contact area of the fourth contact 170 on the first interface 120-1 may be larger than the contact area on the first interface 120-1 of any of the first contact 130, the second contact 140 and the third contact 150.

Optionally, as also depicted in FIG. 1, the vertical Hall sensor structure 100 may comprise an electrical coupling structure 230. The electrical coupling structure may be arranged and configured to electrically couple the fourth contact 170 to the buried layer 100 to lower a resistance between the fourth contact 170 and the layer 160 compared with a resistance between the second contact 140 and the layer 160. For instance, the electrical coupling structure 230 may comprise a well 240 or a trench comprising a material with a higher conductivity than the material comprised in the Hall effect region 110. For instance, the material comprised in the well 240 or the trench may comprise at least one of a highly-doped semiconductor material and a metal. In other words, the material inside the electrical coupling structure 230 may comprise a higher doping compared to the material of the surrounding semiconductor material, may comprise a highly-doped poly silicon or a metal such as tungsten (W). In other cases the electrical coupling structure 230 may be an n-CMOS-well or a HV-nCMOS-well (HV stands for high-voltage, which means reaching deep below interface 220-1) with doping concentration of $10_{17}/cm^3 \ldots 10^{18}/cm^3$ and depth between 1 μm and 7 μm in contrast to the shallow n+S/D-diffusions or implantations for the contacts 130, 140, 150, 170 with concentration larger than $10^{18}/cm^3$ and depth less than 1 μm and in contrast to n-Hall-diffusions or implantations for the Hall-region 110 with doping concentration of $10^{15}/cm^3 \ldots 10^{17}/cm^3$ and depth equal or larger than the depth of 230.

It may be advisable to electrically decouple the fourth contact 170 from the other contacts 130, 140, 150 mentioned. Apart from implementing a sufficiently large distance between the respective contacts, the vertical Hall sensor structure 100 may optionally comprise a decoupling structure 250 arranged between the fourth contact 170 and any or all of the first, the second and the third contacts 130, 140, 150 to at least partially electrically decouple the fourth contact 170 from the first, second and third contacts 130, 140, 150. The decoupling structure 250 may, for instance, comprise a material forming a pn-junction arranged and configured to be operated in a reverse-biased state, when the vertical Hall sensor structure 100 is operated. The decoupling structure 250 may comprise a material with an opposite conductivity type compared to the Hall effect region 110. In other words, the decoupling structure 250 may comprise, for instance, a p-type semiconducting material, when the Hall effect region 110 comprises an n-type semiconducting material or vice-versa. Such a pn-junction may be in contact with a first interface 120-1 to reduce or even prevent a current exchange between the fourth contact 170 and the other contacts 130, 140 and 150. In a plan view the geometry of the decoupling structure 250 and of the contact 170 and coupling structure 230 can be implemented such that it does not lead to different resistances between 130 and 140 and 140 and 150. In other words, it may also be possible to implement a less efficient decoupling structure 250. However, it may be interesting to provide it in a way to keep the asymmetry of the resistances between the contacts 130, 140, 150, 170 to a minimum. For instance, the decoupling structure 250 may extend completely down towards the layer 160. Depending on the layout and the design of the structure 100, the decoupling structure 250 may be configured to completely prevent a current flow between interfaces/faces 120-2 and 220-1 from at least one, some or all of the first, second and third contacts 130, 140, 150 to the fourth contact 170, since the decoupling structure 250 does not hamper the current flowing in the layer 160. Naturally, in other embodiments the decoupling structure 250 may be configured to allow a current to flow between the first contact 130 and the fourth contact 170 being substantially identical to the current between the third contact 150 and the fourth contact 170.

The decoupling structure 250 may comprise a trench 260 comprising a width along a direction 180 between the fourth contact 170 and any or all of the first, second and third contacts 130, 140, 150 in a plane equal or parallel to the main surface 220-1 of the substrate 210. The width may, for instance, comprise at least 50% of a smallest distance between the first and second interfaces 120-1, 120-2.

When the decoupling structure 250 blocks the current, for instance in the case of the trench or a pn-junction in the reverse-biased state, the situation may have to be distinguished between the case, in which the decoupling structure 250 reaches down to the layer 160, and the case, in which the decoupling structure 250 does not reach down to the layer 160. In the first case, the width of the decoupling structure 250 may be of less importance or even unimportant as long as no break-through occurs. In the second case, it may be advisable to implement the decoupling structure 250 with a higher width the more shallow it becomes. In the limit of the decoupling structure 250 being implemented with a vanishing depth, it may be advisable to arrange the contacts 150 and 170—and optionally the electric coupling structure 230—to comprise a sufficiently high distance from one another.

Figure 2:
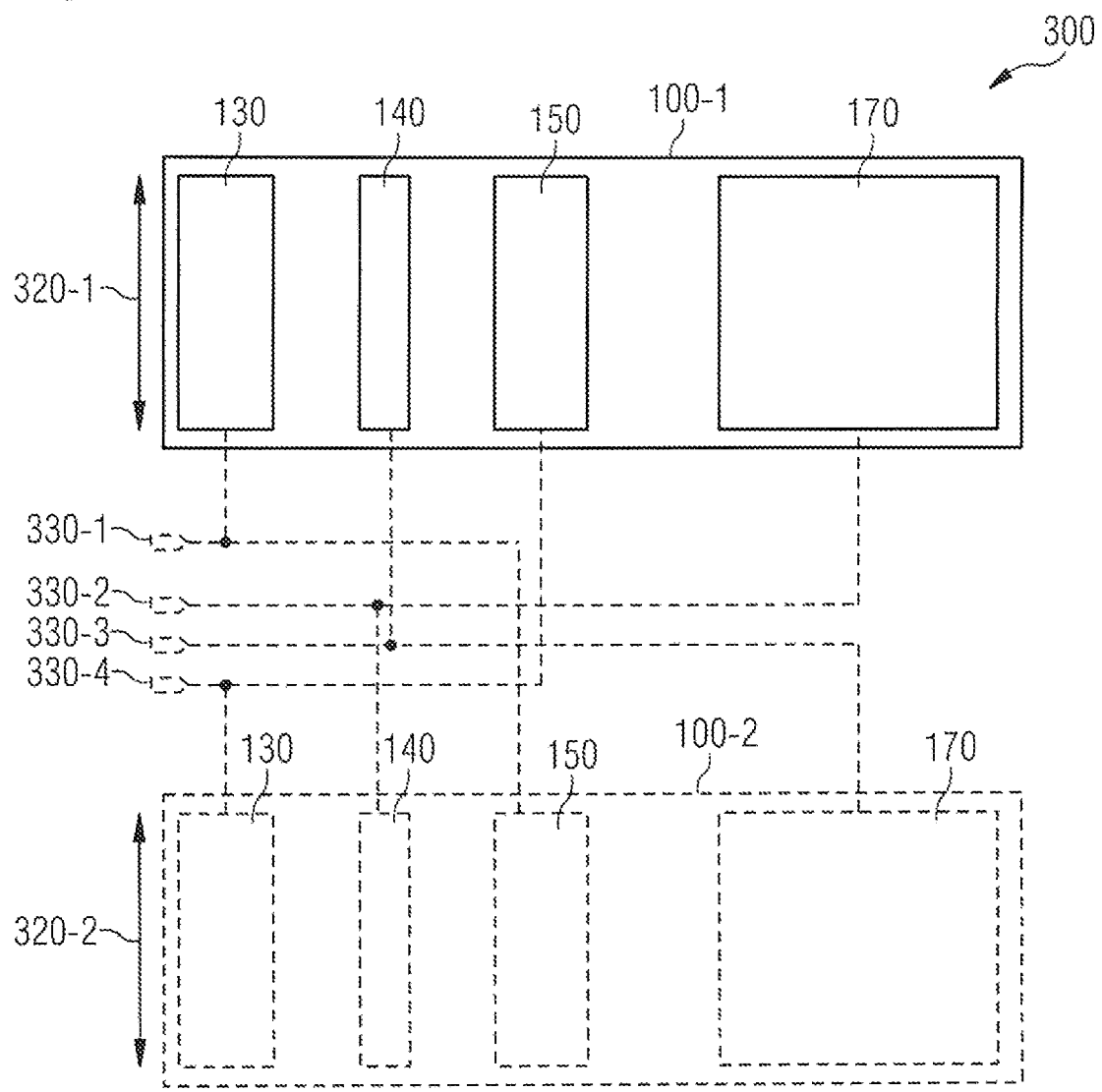
FIG. 2 shows a simplified plan view of a vertical Hall sensor device according to an embodiment.

FIG. 2 shows a schematic plan view of a vertical Hall sensor device 300 comprising at least one vertical Hall sensor structure 100 as outlined before. However, as also depicted as an optional feature in FIG. 2, the vertical Hall sensor device 300 according to an embodiment may comprise more than just one vertical Hall sensor structure 100. To be more precise, the embodiment depicted in FIG. 2 comprises a first vertical Hall sensor 100-1 and a second vertical Hall sensor structure 100-2. Each of the first, second, third and fourth contacts 130, 140, 150, 170 of the first vertical Hall sensor structure 100-1 may be coupled to exactly one contact of the first, second, third and fourth contacts 130, 140, 150, 170 of the second vertical Hall sensor structure 100-2 during a measurement operation of the vertical Hall sensor device 300 and vice-versa. For instance, the second contact 140 of a vertical Hall sensor structure 100-1 may be coupled to the fourth contact 170 of the second vertical Hall sensor structure 100-2 permanently, during all of the measurement operations of the device 300 or during at least one measurement operation of the device 300. This option is schematically depicted in FIG. 2 by a dashed line.

However, to be more flexible, the vertical Hall sensor device 300 may comprise a multiplexer 310 capable of changeably coupling at least two of the contacts 130, 140, 150, 170 of the first vertical Hall sensor structure 100-1 to at least two of the corresponding contacts 130, 140, 150, 170 of the second vertical Hall sensor structure 100-2. The implementation of the multiplexer 310 is, in other words, an optional implementation which may be implemented additionally or alternatively to the interconnection of the second contact 140 of the first vertical Hall sensor structure 100-1 and the fourth contact 170 of the second vertical Hall sensor structure 100-2 depicted by the dashed line. As a consequence, the corresponding interconnections of the multiplexer 310 to the contacts 130, 140, 150, 170 of the vertical Hall sensor structures 100-1, 100-2 are shown by dotted lines.

Optionally, the vertical Hall sensor structures 100-1, 100-2 may be configured to detect a magnetic field component along a first axis 320-1 and a second axis 320-2, respectively. The axes 320 may or may not coincide with any of the directions 180, 190 described before in the context of the orientation of the substrate 210. However, the axes 320-1, 320-2 may comprise an angle with respect to each other, which either does not exceed 10° as shown in FIG. 2, where the axes 320-1, 320-2 are substantially parallel having angle of approximately 0°, or they may be in a range between 80° and 100° as will be outlined in more detail with respect to FIGS. 11 and 12.

Optionally, the vertical Hall sensor device 300 may comprise a first terminal 330-1, a second terminal 330-2, a third terminal 330-3 and a fourth terminal 330-4, which are each coupled to exactly one contact of the first, second, third and fourth contacts 130, 140, 150, 170 of the first vertical Hall sensor structure 100-1 during a measurement operation of the vertical Hall sensor device 300. Moreover, each of the terminals 330 may also be coupled to exactly one contact of the first, second, third and fourth contacts 130, 140, 150, 170 of the second vertical Hall sensor structure 100-2 during the measurement operation. For the sake of simplicity only, one possible connection scheme is illustrated in FIG. 2. Naturally, when the contacts 130, 140, 150, 170 comprise more than just one physical contact structure, for instance a plurality of plugs coupled in parallel, the respective plurality is considered to be one contact.

Figure 3:
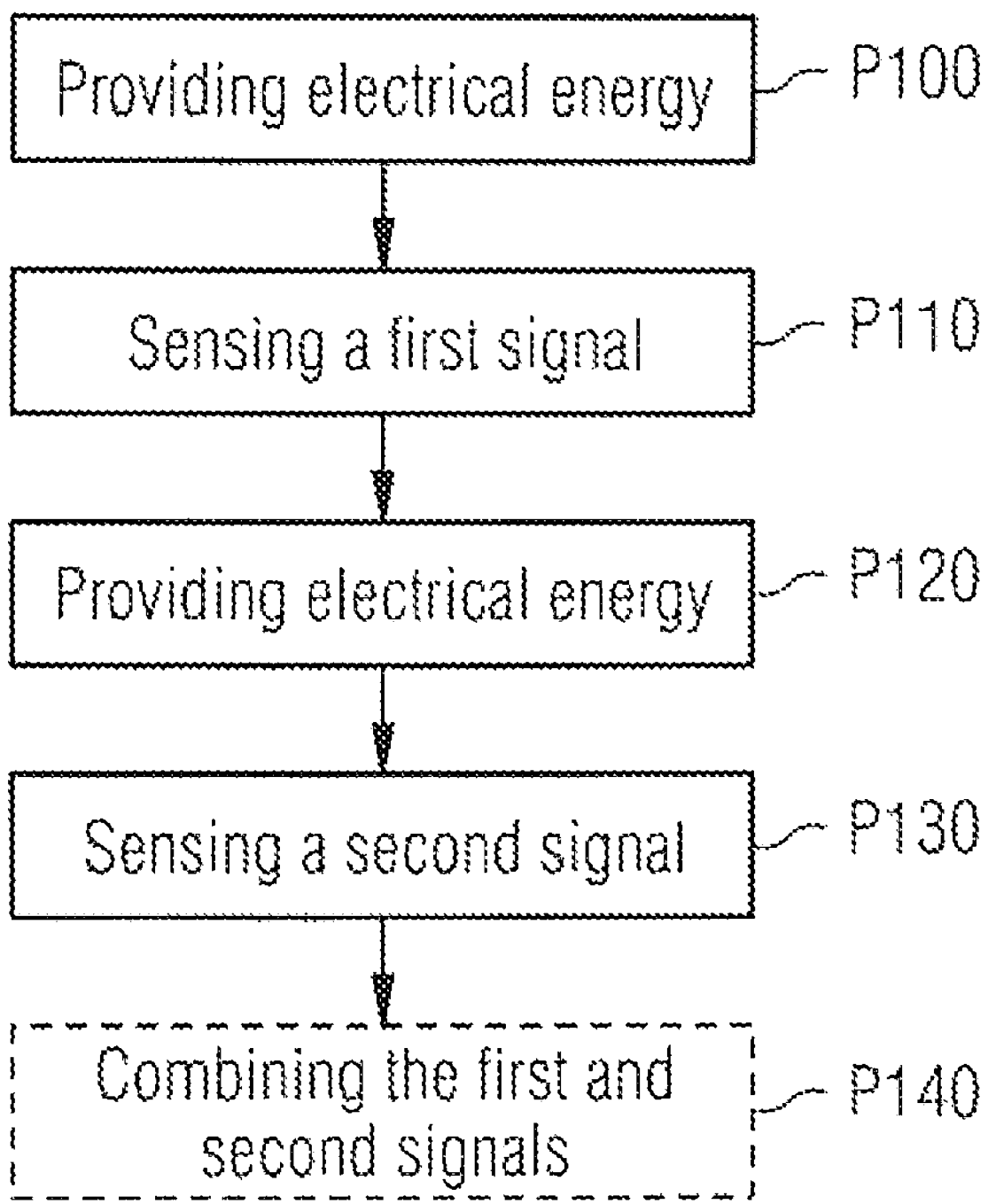
FIG. 3 shows a block diagram of a method according to an embodiment.

FIG. 3 shows a flowchart of a method according to an embodiment, which may, for instance, be implemented using a vertical Hall sensor structure 100 or a vertical Hall sensor device 300.

Based on a Hall sensor structure 100 or a Hall sensor device 300 as described before, the first and third contacts 130, 150 may be considered a first pair of contacts, while the second and fourth contacts 140, 170 may be considered a second pair of contacts. In a process P100, electrical energy is provided to the first pair of contacts during a first phase of operation. In a process P110, a first magnetic-field sensitive signal is sensed at the second pair of contacts during the first phase of operation. In a process P120, electrical energy is provided to the second pair of contacts during a second phase of operation. In a process P130, a second magnetic-field sensitive signal is sensed at the first pair of contacts during the second phase of operation. In an optional process P140, the first and second magnetic-field sensitive signals may be combined to generate an output signal indicative of the magnetic field, a component thereof or another magnetic field-related quantity. For instance, combining the signals may comprise averaging the signals or otherwise arithmetically combine them or values comprised in the signals.

For instance, in the case of a spinning current implementation, a current may be provided through the first contact 130 and the third contact 150 of the vertical Hall sensor structure 100 in the first phase or mode of operation of the vertical Hall sensor structure 100. A first voltage may be sensed between the second contact 140 and the fourth contact 170 of a vertical Hall sensor structure 100. A current flowing through the second contact 140 and the fourth contact 170 of the vertical Hall sensor structure 100 may be generated or provided in the second phase or mode of operation. A second voltage may be sensed between the first contact 130 and the third contact 150 in the second phase or mode of operation. Optionally, the method may also comprise generating an output signal, the output signal being indicative of a magnetic field component parallel to a main surface 220 of a substrate 210 comprising the vertical Hall sensor structure 100. The output signal may be based on the sensed first and second voltages. For instance, the processes P100, P110, P120 and P130 may be initiated or controlled by a control circuit, if implemented. Similarly, a measurement circuit may be used for the sensing processes P110 and P130 and, optionally, also for generating the output signal. However, it should be noted that any of these processes may be implemented by a signal processing circuit. Any of the previously-mentioned circuits may be part of the vertical Hall sensor device 300 or may be implemented somewhere else. Moreover, even when the respective circuits are part of the vertical Hall sensor device 300, they may be implemented on a different substrate than the vertical Hall sensor structure 100.

Similarly, the processes P100 and P120 may comprise providing a current to more than just one vertical Hall sensor structure 100, when more than one vertical Hall sensor structure 100 is involved as discussed, for instance, with respect to the vertical Hall sensor device 300 shown in FIG. 2.

Similarly, in the case of a spinning voltage measurement scheme, instead of providing a current in the processes P100 and P120 a voltage may be provided to the respective pairs of contacts. In the processes P110 and P130 a current may then be measured. The respective terminals 330 of the sensor device may have to be coupled differently to the contacts of the sensor structure 100 in the spinning voltage measurement scheme compared to the spinning current measurement scheme.

Naturally, although FIG. 3 shows a specific sequence of the processes, in different embodiments, the processes described may be carried out in a different sequence or order. Moreover, the processes may be performed or carried out at least partially simultaneously or in a timely overlapping manner. For instance, the process P100 and P110 as well as the processes P120 and P 130 may be conducted at least partially simultaneously or overlapping in time.

Figure 4:
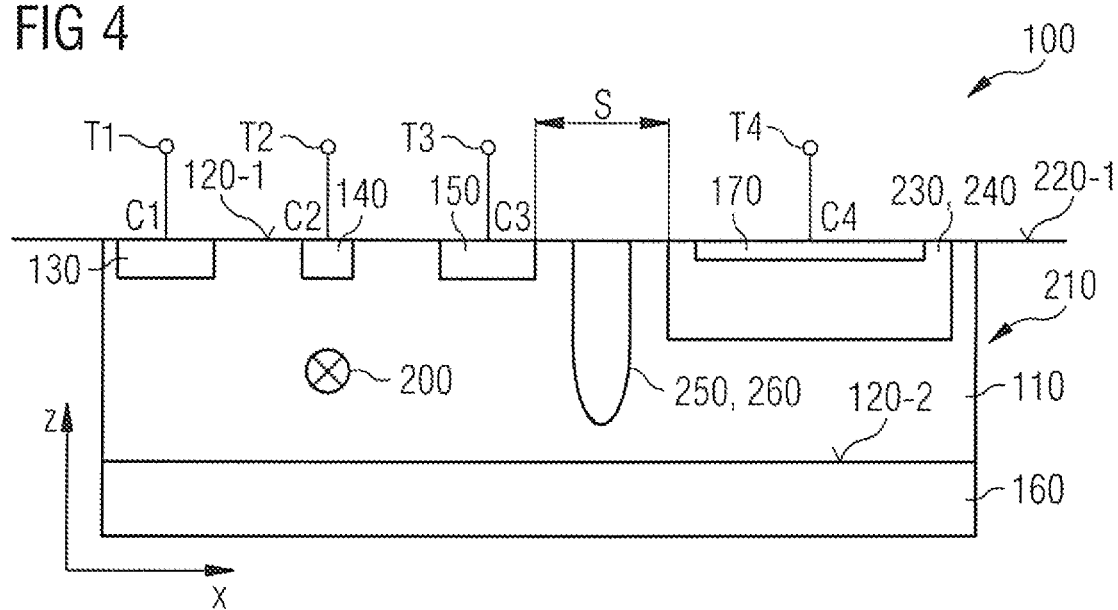
FIG. 4 shows a cross-sectional view of a vertical Hall sensor structure according to an embodiment.
Figure 5:
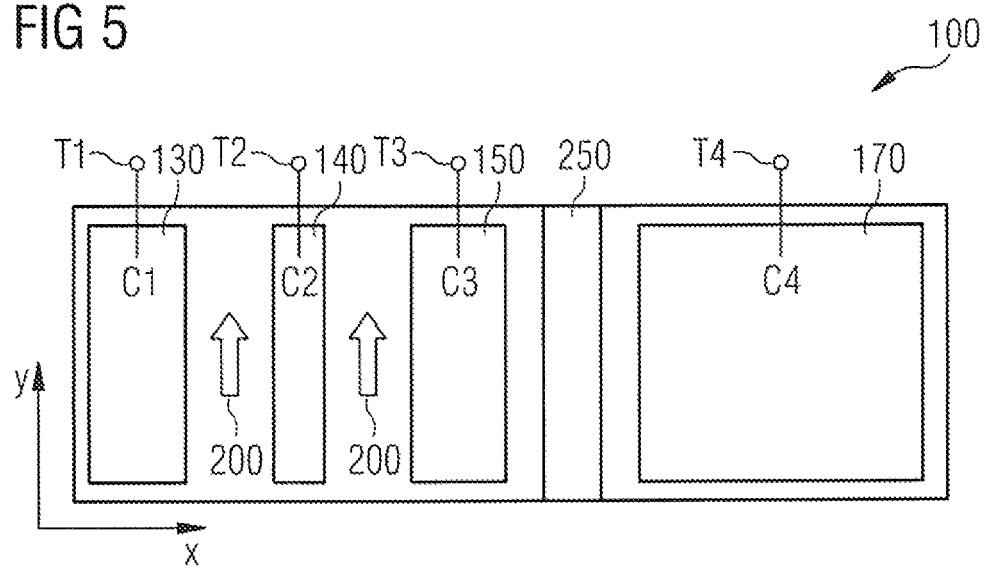
FIG. 5 shows a plan view of a vertical Hall sensor structure of FIG. 4.

FIG. 4 shows a schematic cross-sectional view of a vertical Hall sensor structure 100 according to an embodiment, whereas FIG. 5 shows the corresponding schematic plan view of the structure 100. As outlined before, a magnetic field 200 or a magnetic field component along the second direction or y-direction acts on the vertical Hall sensor structure 100.

In the embodiment shown in FIGS. 4 and 5, four contacts 130, 140, 150, 170, also referred to as C1, C2, C3 and C4, respectively, are deposited on the top or main surface 220-1 of the substrate 210. Three of the contacts C1, C2, C3 are arranged along the x-direction. Accordingly, the device or structure 100 is mainly responsive to y-components of the magnetic field 200. The contacts C1, C2, C3 and C4 are coupled to terminals 330 (T1, T2, T3 and T4, respectively).

The contacts C1, C2 and C3 are near the top of the Hall effect region 110, which may be low or moderately n-doped with doping concentrations of, for instance, less than $10^{17}/cm^3$. (the contacts are highly n-doped with $>10^{17}/cm^3$). The bottom of the Hall effect region 100 is—via its interface 120-2—at least partly in contact with the highly conductive layer 160, which may, for instance, comprise an n-doping concentration of more than $10^{17}/cm^3$. Naturally, also other doping concentrations and/or p-dopings may be used and implemented. The values given merely represent examples.

The Hall effect region 110 may, for instance, be an epitaxial layer and the highly conductive (buried) layer 160 may be an n-buried layer or well. Yet the Hall effect region 110 may also be a n-CMOS well, which may be fabricated in a high-voltage process with a large depth. The layer 160 may be processed by a deep ion-implantation and annealing process, to name just one example. The depth of the Hall effect region 110 may be about 5 µm or more. However, also smaller values may be used.

Figure 6:
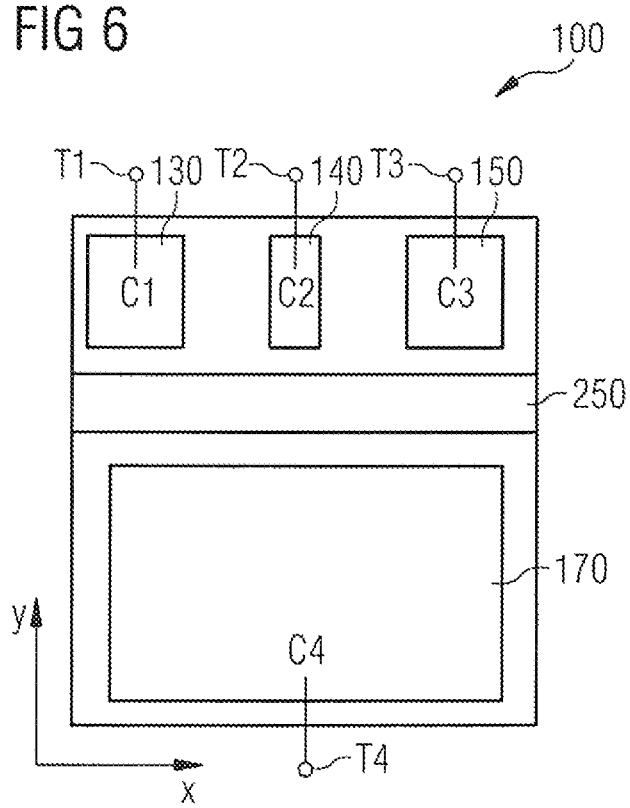
FIG. 6 shows a plan view of a vertical Hall sensor structure according to a further embodiment.
Figure 7:
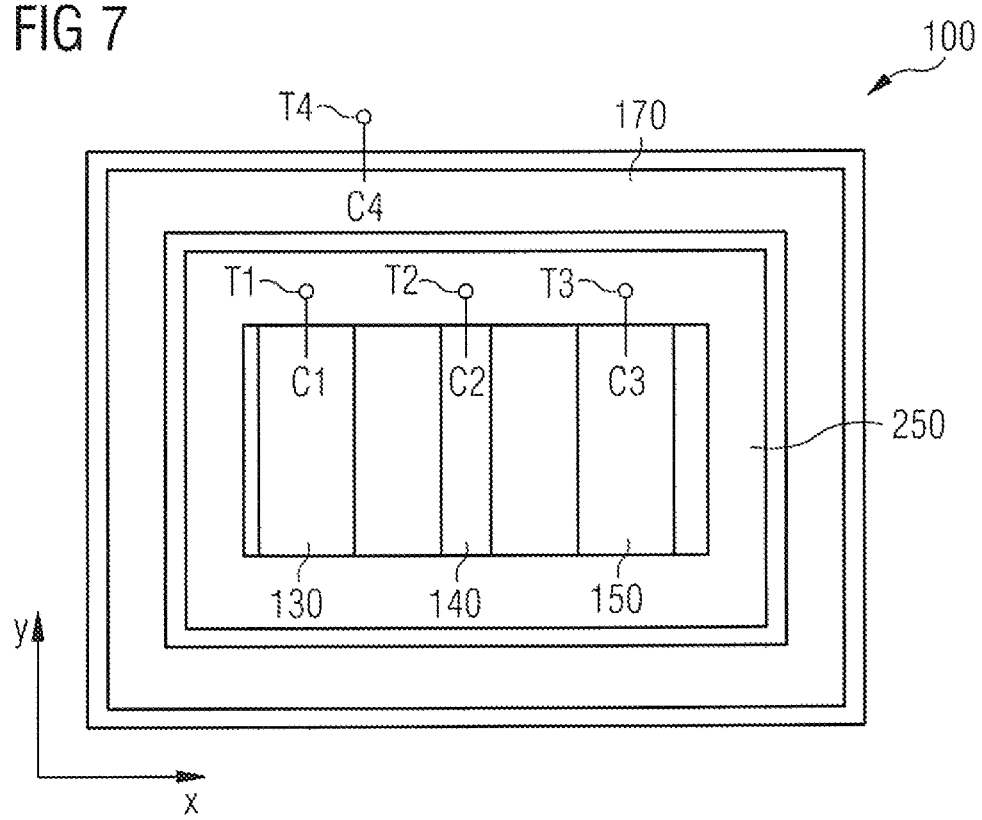
FIG. 7 shows a vertical Hall sensor structure according to an embodiment.

The fourth contact 170 (C4) may be implemented larger than the other contacts and may also be deeper. It may comprise an electric coupling structure 230 as outlined below. This may allow the fourth contact 140 to be in contact with the buried layer 110 with low Ohmic resistance. The position of the fourth contact 140 may be freely placed or even arbitrarily chosen. It may be at the right as shown in FIGS. 4 and 5, at the left of the Hall region 110 or also in front or behind as shown in FIG. 6. It may also be ring-shaped and arranged around the Hall region 110 as shown in FIG. 7.

The fourth contact 170 may reach down to the buried layer 110, yet in many process technologies this may not be possible. In such a case, it may be advisable to choose a technology, design or position of the contact 170, which reaches down deepest to ensure lowest resistance to the buried layer 110. It may also be possible to stack several tubs or structures with shallow highly doped tubs such as an n+S/D diffusion technique (n-doping for source/drain diffusions of MOS-transistors) and deeper lower doped tubs like an nCMOS-well.

The fourth contact 170 along with its electric coupling structure 230, which may be implemented as the previously-described well 240, is decoupled from the other contacts 130, 140, 150 by the decoupling structure 250, implemented here as a trench 260 extending from the first interface 120-1 almost completely down to the second interface 120-2, which makes contact between the Hall effect range 110 and the layer 160. As a consequence, the fourth contact 170 and its electrical coupling structure 230 has a smallest distance S from any of the contacts 130, 140, 150, which may, for instance, be at least 50% of the distance between the first and second interfaces 120-1, 120-2. Naturally, in other embodiments, also smaller or larger values may be used.

The fourth contact 170 may be decoupled from the other contacts 130, 140, 150 by the decoupling structure or portion 250, which may be or comprise a reverse-biased pn-junction, an isolating trench or simply a wide spacing S, where S may be larger than at least half of the depth of the Hall effect region 110. For instance, it may be an isolating portion that reaches down all way to the buried layer 110. Its purpose is to prevent a current flow from the first three contacts 130, 140, 150 (C1, C2, C3) to the fourth contact 170 (C4) through other parts of the structure 100 than the layer 160. The layer 160 may, hence, operate as a contact at the bottom of the Hall effect region 110.

FIG. 6 shows a schematic plan view of a vertical Hall sensor structure 100 according to an embodiment comprising the fourth contact 170 serving as the buried layer 110 contact, which is shifted along the second direction or y-direction with respect to the first, second and third contacts 130, 140, 150 (C1, C2, C3). Between the fourth contact 170 and the other three contacts 130, 140, 150 the decoupling structure 250 is arranged extended substantially along the x-direction. Therefore, compared to the implementation depicted in FIG. 5, the decoupling structure 250 is rotated by approximately 90°.

Similarly, FIG. 7 shows a schematic plan view of a vertical Hall sensor structure 100 comprising a ring-shaped buried layer contact or fourth contact 170 surrounding the other three contacts 130, 140, 150. Accordingly, the decoupling structure 250 is also substantially ring-shaped and is arranged between the fourth contact 170 and the three other contacts 130, 140, 150.

However, although the fourth contact may substantially be placed arbitrarily, it may be advisable to arrange the first three contacts 130, 140, 150 along a straight line to allow a clear definition of the measurement direction of the vertical Hall sensor structure 100. Due to the layer 160 being in contact with the second interface 120-2, causing at least in some phases or modes of operation of the vertical Hall sensor structure, a current to flow into the substrate 210 towards the layer 160, arranging the three other contacts 130, 140, 150 along a straight line may cause the vertical Hall sensor structure 100 to be responsive to magnetic field components perpendicular to both the direction into the substrate 210 and the previously-mentioned straight line. In other words, by aligning the first, second and third contacts 130, 140, 150 along the straight line and by allowing the current to flow into the substrate 210, the axis 320 along which the vertical Hall sensor structure 100 is responsive to the magnetic field 200, can be defined more easily.

Figure 8:
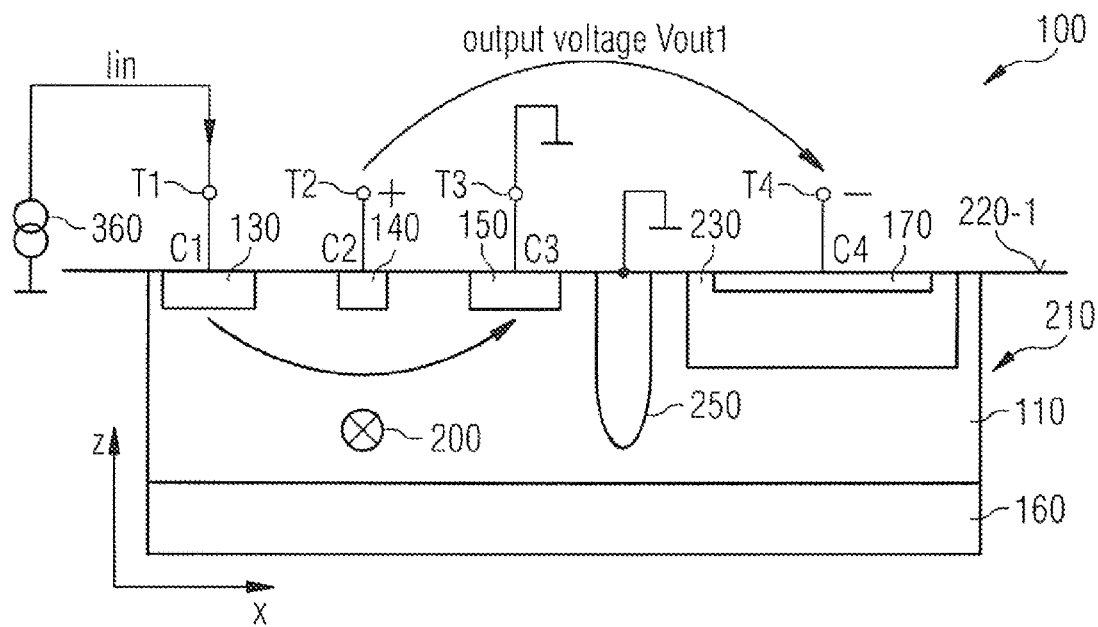
FIG. 8 shows a vertical Hall sensor structure according to an embodiment in a first phase of operation.
Figure 9:
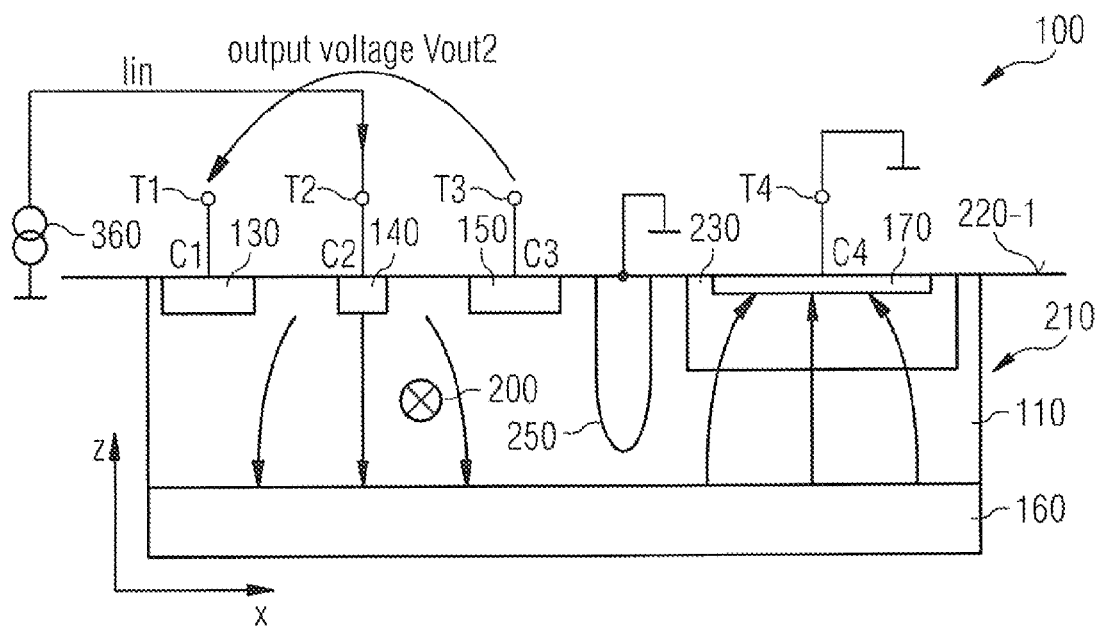
FIG. 9 shows a cross-sectional view of the vertical Hall sensor structure of FIG. 8 in a second phase of operation.

The device can be operated in at least two operating phases, two of which are illustrated in FIGS. 8 and 9. FIG. 8 shows a schematic cross-sectional view of the structure 100 in phase 1, while FIG. 9 shows the same structure 100 in phase 2 in a similar cross-sectional view.

In phase 1, a current source 360 provides an input current $I_{in}$, which flows between the first contact 130 (C1) and the third contact 150 (C3), which is coupled to a reference potential, such as ground. Also the current source 360 is coupled to ground. An output voltage $V_{out1}$ can be sensed, tapped or sampled between the second contact 140 (C2) and the fourth contact 170 (C4). If the device is symmetric in x-direction with respect to the center of C2, the potentials at C2 and C4 are exactly between the potentials of C1 and C3. Thus in a phase 3, where the current $I_{in}$ flows into the opposite direction between C1 and C3, these potentials are the same. This may be interesting for improving the result of the spinning current measurement scheme depicted here.

The second contact 140 (C2) is left of the current flow whereas the buried layer is right of the current flow. Therefore, the potential at C2 may increase, whereas the potential of the layer 160 may decrease with an applied magnetic field in the y-direction. The fourth contact 170 (C4) taps the potential of the layer 160. The potential at C4 may be identical to the buried layer potential, when the decoupling is perfect. For instance, this may be the case, when the decoupling structure 250, which is also coupled to the reference potential, reaches down to the layer 160 and its conductivity is high enough or its resistance is low enough to neglect—at least partially—any voltage drop.

In the second phase (phase 2), the input and output contacts are swapped. In this phase, the current $I_{in}$ is input via contacts C2 and C4, whereas the output voltage $V_{out2}$ is tapped between C1 and C3. Again, if the device or structure 100 is perfectly symmetric in x-direction with respect to the center of C2, the potentials of C1 and C3 are identical at zero magnetic field. However, this time they may not be exactly midway between the potentials of C2 and C4. They may be closer to the potentials of C2 than of C4, which may cause some small errors in the cancellation of thermally induced offsets, when the current direction in a phase 4 is reversed. This may be the case, since then also a common mode potential of the output terminals C1 and C3 may experience a jump compared to phase 3. FIG. 9 shows the corresponding schematic overview as a cross-sectional view.

The overall signal of this spinning scheme, representing, for instance, the output signal, may be the sum of output voltages $V_{out1}$ and $V_{out2}$ of both phases. Additional phases 3 and 4 may be added, whereby the current input and output terminals are swapped and the positive and negative output signal terminals are also swapped compared to phases 1 and 2, respectively.

In the above explanation, reference was made to the spinning current scheme, in which a constant current $I_{in}$ may be injected into the input terminals and the output voltage may be tapped between the signal terminals or contacts. Spinning voltage schemes, in which a constant voltage source is connected or coupled to the input terminals instead of the constant current source 360 and the outputs are shorted by an ampere-meter and the output signal is measured current, may also be used.

In order to improve the symmetry of a device, two or more structures 100 may be coupled to one another, for instance, in an anti-parallel fashion, as depicted, for instance, in FIG. 10. FIG. 10 shows a schematic cross-sectional view of a device 300 comprising a first structure 100-1 and a second structure 100-2. To be more precise, the device 300 is operated in the second phase. In FIG. 10, the contacts of the second structure 100-2 are denoted by reference signs additionally marked by an apostrophe.

In the arrangement shown in FIG. 10, the current source 360, which is not only coupled to the device 300, but also to a terminal for the reference potential such as ground, generates or provides an input current $I_{in}$ to both the first and second structures 100-1, 100-2. To be more specific, since the two structures 100-1, 100-2 are anti-parallel coupled to one another, approximately half of the input current $I_{in}$ is provided to the second contact 140 of the first structure 100-1 and approximately half of the input current $I_{in}$ is coupled to the fourth contact 170' of the second structure 100-2. Accordingly, the second contact 140' of the second structure 100-2 is coupled to the fourth contact 170 of the first structure 100-1, which in turn is coupled to the reference potential. The output voltage $V_{out2}$ is obtainable between the first and third contacts 130, 150 of the first structure 100-1. Due to the anti-parallel coupling of the two structures 100-1, 100-2, the first contact 130' of the second structure 100-2 is coupled to the third contact 150 of the first structure 100-1 and, accordingly, the third contact 150' of the second structure 100-2 is coupled to the first contact 130 of the first structure 100-1.

As a consequence, in this arrangement two contacts (C1 and C3') are shorted to one terminal to give a first terminal 330-1 (T1), while the contacts C2 and C4' are shorted to a second terminal 330-2 (T2), C3 and C1' are shorted to a third terminal 330-3 (T3) and C4 and C2' are shorted to a fourth terminal 330-4 (T4). One of the two contacts belongs to the first structure 100-1 (non-primed contacts C1, C2, C3, C4) and the other to the second structure 100-2 (primed contacts C1', C2', C3', C4'). This gives four terminals 330-1, . . . , 330-4 (T1, T2, T3, T4), which may be electrically coupled to other circuits or to other parts of the device 300.

In phase 1, the shorts may remain identical. Although the shorts need not remain permanent, such as hard-wired implementations, it may be advisable to keep them identical at least in phases 1 and 2. For instance, a transistor such as a MOS switch and an optional resistor may be implemented. However, it may be advisable to use a circuit having essentially the same resistance in phases 1 and 2.

This arrangement may have different input resistances in both phases. It may also have different output resistances in both phases, yet a common mode potential of the output signals may be midway between the supply potentials in both phases. This may mean that a swap of supply terminals does not change the common mode potential of the output signals and this may be interesting for a good cancellation of offsets in the spinning scheme.

However, some current may flow through the shorts between C1 and C3' and/or C3 and C1' in order to pull the common mode potential of the output terminals midway between the supply potentials. This may lead to some small offset errors due to a Peltier effect. To keep it small, the current may be kept small and thus the contacts C1, C3 and C1', C3' may be designed to have common mode potentials as close as possible to the average of potentials of C2 and C4 or C2' and C4' in phase 2 for the single device 300. The connection between the two structures 100 may be such that in phase 1 both structures 100 have a first current distribution and in phase 2 both devices have a second current distribution, such that the first and the second current distributions are different.

FIGS. 11 and 12 show schematic plan views of vertical Hall sensor devices 300 comprising a first vertical Hall sensor structure 100-1 and a second vertical Hall sensor structure 100-2. However, in contrast to the previously-described devices 300 comprising a vertical Hall sensor structure 100-1, 100-2, the devices 300 shown in FIGS. 11 and 12 comprise a different orientation with respect to the structures 100. To be more precise, in the previously-described devices 300, the axes 320 corresponding to the orientation of the magnetic field 200 or rather its magnetic field component, to which the structures 100 are sensitive, have been substantially aligned in parallel. Here, the axes 320 are arranged substantially perpendicular with respect to one another. However, in other embodiments, the structures 100 may be arranged differently, for instance, comprising different angles in terms of their axes 320. In other words, the axes 320 do not need to be aligned in parallel as previously described.

In the case of a homogenous or semi-homogeneous magnetic field, the structures 100 may be arranged differently than depicted in FIGS. 11 and 12. Instead of the L-shaped arrangement, structure 100-2 can be moved downward in the figures to obtain, for instance, a more T-shaped layout. Naturally, other arrangements can also be used including, for instance, arrangements having a larger distance between the structures 100. As an example, one structure 100 can be arranged at a first edge of a die, while the second structure 100 is located at the opposite edge of the same die. Hence, a distance of several 100 μm and even several millimeters can easily be implemented. In such a case, the electrical connection and the angular arrangement of the structures 100 may be important.

In the devices 300 shown in FIGS. 11 and 12, the axes 320 are arranged non-parallel such that, for instance, one of the structures 100 is responsive to a magnetic field component along the x-direction $V_x$, while another structure may be responsive to a magnetic field component along the y-direction ($V_y$).

To be little more precise, in the devices 300 depicted in FIGS. 11 and 12 two rectangular Hall effective regions 100, 100' are arranged with respect to one another, each comprising three or four contacts. According to the axes 320, the Hall effective regions 110 are also arranged orthogonally to one another. In FIG. 11, the contacts of the devices are connected in parallel such that the first contacts 130, 130' are coupled together forming a first terminal 330-1. Similarly, also the second terminals 140, the third terminals 150 and the fourth terminals 170 are coupled in parallel to form second, third and fourth terminals 330-2, 330-3, 330-4, respectively. In contrast, in the device 300 shown in FIG. 12, the contacts 130, 140, 150, 170 are coupled to one another in an anti-parallel manner forming the respective terminals 330-1, 330-2, 330-3, 330-4 as previously described in the context of FIG. 10.

Due to the arrangement of the axes 320, the devices 300 shown in FIGS. 11 and 12 may be responsive to an overall magnetic field component having a direction in the plane of the main surface 220 (not shown in FIGS. 11 and 12), which is tilted by approximately 45° with respect to the individual axes 320-1, 320-2. In other words, an overall axis 370 of the two devices 300 shown in FIGS. 11 and 12 may be effective along a direction enclosing an angle of approximately 45° with respect to the first and second axes 320-1, 320-2. Moreover, if only one of both devices is rotated by 180° the effective direction of the complete arrangement rotates by 90°.

FIG. 13 shows a schematic cross-sectional view of a device 300 in a phase 2 operation as previously described. Similarly, FIG. 14 shows also a similar device 300 in a phase 2 operation. However, the devices 300 as shown in FIGS. 13 and 14 differ from the previously described devices 300 with respect to the fact that they are subjected to different magnetic fields 200-1, 200-2 acting onto the different vertical Hall sensor structures 100-1, 100-2, respectively, of the device 300. In the examples shown in FIGS. 13 and 14, the magnetic fields 200-1, 200-2 are anti-parallel oriented to one another.

To allow the different structures 100-1, 100-2 to be subjected to anti-parallel oriented magnetic fields, the structures 100 may be arranged at different locations on a substrate 210 (not shown in FIGS. 13 and 14) or they may be arranged on different substrates. Naturally, the same is also true for other angles with respect to the corresponding axes 320 or their magnetic fields 200. In other words, the structures 100 may be arranged close to one another or they may be separated from one another by, for instance, a distance 380 as depicted in FIGS. 13 and 14. Here, the distance 380 corresponds to a spacing of the structures 100-1, 100-2 in the (x,y)-plane. The magnetic fields 200-1, 200-2 are oriented along a first magnetic field direction 200-1 and a second magnetic field direction 200-2 in the opposite direction in FIGS. 13 and 14. However, apart from these differences and the ones described below, FIGS. 13 and 14 resemble, for instance, FIG. 10. As a consequence, reference is made to this Figure and its description.

Hence, the two structures 100-1, 100-2 may be close together, for instance, they may be immediate neighbors, or they may be far apart having, for instance, spacings or distances 380 of 500 µm or 2.5 mm from one another, to name just some examples. Naturally, other distances 380 may also be used. In this context, the meaning of the term "far" may depend on the source of the magnetic field. If, for instance, the magnetic field is generated by two 5 µm wide on-chip wires in a distance of 20 µm with anti-parallel current flow, a spacing of 20 µm can be already sufficiently far apart to create different magnetic fields 200 in the respective structures 100, if, for instance, the first structure 100-1 is closer to the left wire and the second structure 100-2 is closer to the right wire.

If the magnetic field source is external from the chip, for instance like a magnetic tooth wheel with domains on the scale of millimeters, also the spacing of the two structures 100 may be on a comparable spacing in the range of millimeters. In the first case, they may experience the same magnetic field. In the second case they may experience gradients of magnetic fields or, in other words, the first structure 110-1 may sample the field at a first test point and the second structure 100-2 may sample the field at a second test point different from the first test point. In this case the field components on both test points may have different signs, for instance, a positive By-component at the first structure 110-1 and a negative By-component at the second structure 110-2. In such a case the contacts C1' and C3' may have to be swapped or the contacts C2' and C4' have to be swapped. In the first embodiment shown in FIG. 13, the contacts C1' and C3' are swapped with respect to the implementation of FIG. 10 due to the different polarity of magnetic fields 200-1, 200-2 at both structures 100-1, 100-2, respectively. In the second embodiment shown in FIG. 14, the contacts C2' and C4' are swapped with respect to the device 300 of FIG. 10 due to different polarity of magnetic fields 200-1, 200-2.

The second device 300 of FIG. 14 may be less symmetrical than the first one of FIG. 14, because in the second device the contacts C2 and C2' are shorted, whereas in the first one C2 and C4' are shorted. If the current direction in the second device 300 in phase 2 is reversed, the common mode potential, which may be the average of the potentials at both terminals, at the output terminals of the device 300 may jump. In the above depicted case, the common mode potential of the output signals may be higher than half of the supply voltage, whereas it may be lower than half of the supply voltage, if the current is injected into contacts C4 and C4', while the contacts C2 and C2' are grounded.

In the first embodiment shown in FIG. 13, which is also shown in phase 2, the common mode potential of the output terminals is at half of the supply voltage and, thus, it may remain unchanged, if current is injected into contacts C4 and C2', while contacts C2 and C4' are grounded. Thus, the first embodiment may be more symmetric and may, hence, exhibit a better performance under some circumstances.

Hence, the symmetrization may cost current flowing over the wire between C1 and C1', which may also flow over the wire between C3 and C3', whereas in the second embodiment of FIG. 14 in phase 2 the current flowing over the wire between C1 and C3' and over the wire between C3 and C1' may be less or even non-existing.

Examples described here may lead to a more symmetrical vertical Hall effect structure 100 and a corresponding device 300 with a layer 160.

For instance, example include a vertical Hall effect device 300 comprising a Hall effect region 110 with a first face 120-1 closer to the top surface 220-1 of a substrate 210 than a second opposite face 120-2. It may include three contacts 130, 140, 150 on the first face 120-1, whereby the resistance between a first contact 130 and a second contact 140 may be nominally equal to the resistance between a third contact 150 and the second contact 140. A highly conductive layer 160 may be in contact to the Hall effect region 110, whereby this layer 160 may be closer to the second face 120-2 than to the first face 120-1. The structure may further comprise a means to make electric contact to this layer 160 and a fourth contact 170, whereby the resistance between the fourth contact 170 and the layer 160 is smaller than the resistance between the second contact 140 and the layer 160.

This merely defines a structure of a possible device, and not so much its operation. The symmetry of the contacts C1, C2 and C3 is defined by their resistances, because the equality of resistances may be used to avoid or at least limit an offset error in phase 2 of the operation. Equal resistance may be implemented, for instance, by an equal shape of the contacts 130 and 150, but not necessarily of contact 140, which have been differently drawn from contacts 130 and 150 on purpose. Moreover, equal positions of both contacts 130 and 150 with respect to contact 140 as well as identical material properties may help to impellent an equal resistance. In other words, the term "equal resistance" may be a shortcut for this long version of equalities. Contact 170 (C4), however, has less resistance to the layer 160 than contact 140 (C2).

Optionally, the resistance between the first contact 130 and the fourth contact 150 may be nominally equal to the resistance between the third contact 150 and the fourth contact 170. Additionally or alternatively, the fourth contact 170 may be decoupled from the other three contacts 130, 140, 150 by a reverse biased pn-junction, which may optionally reach up to the first face 120-1, by a lateral spacing that may be larger than half of the distance of first and second faces 120-1, 120-2 of the Hall effect region 110. Moreover, the fourth contact 170 may be larger than any of the first, second and third contacts 130, 140, 150.

A second identical device 300 or structure 100 may be connected to the first device 300 or structure 100 such that four different terminals 330 may result, whereby each terminal 330 may be connected to one contact 130, 140, 150, 170 of the first device 300 or structure and one contact 130, 140, 150, 170 of the second device 300 or structure 100 and whereby no contact is connected to more than one terminal 330. The second contact 140 of the first device 300 or structure 100 may be connected to the fourth contact 170 of the second device 300 or structure 100.

In terms of the operation of the device 300 or the structure 100 in a spinning scheme, the scheme may comprise at least two operating phases, whereby in a first operating phase a current flows mainly between the first contact 130 and the third contact 150 and in a second operating phase the current flows mainly between second contact 140 and the fourth contact 170, which may be irrespective of the polarity of the currents and the magnetic fields 200 acting on the device 300 or the structure 100. In the first operating phase, a signal may be tapped between second contact 140 and the fourth contact 170 and in the second operating phase, a signal may be tapped between first contact 130 and third contact 150. Both signals may be combined to give an overall output signal indicative of the magnetic field parallel to the first face 120-1.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Functional blocks denoted as "means for..." (performing a certain function) shall be understood as functional blocks comprising circuitry that is adapted for performing or to perform a certain function, respectively. Hence, a "means for s.th." may as well be understood as a "means being adapted or suited for s.th.". A means being adapted for performing a certain function does, hence, not imply that such means necessarily is performing said function (at a given time instant).

The methods described herein may be implemented as software, for instance, as a computer program. The sub-processes may be performed by such a program by, for instance, writing into a memory location. Similarly, reading or receiving data may be performed by reading from the same or another memory location. A memory location may be a register or another memory of an appropriate hardware. The functions of the various elements shown in the Figures, including any functional blocks labeled as "means", "means for forming", "means for determining" etc., may be provided through the use of dedicated hardware, such as "a former", "a determiner", etc. as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the Figures are conceptual only. Their function may be carried out through the operation of program logic, through dedicated logic, through the interaction of program control and dedicated logic, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes, which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons.

Furthermore, in some embodiments a single step may include or may be broken into multiple substeps. Such substeps may be included and part of the disclosure of this single step unless explicitly excluded.

What is claimed is:

1. A vertical Hall sensor structure comprising:
a Hall effect region arranged between a first interface and a second interface of the Hall effect region;
a first contact, a second contact, a third contact, and a fourth contact, the first, second, third and fourth contacts being closer to the first interface than to the second interface and in contact with the Hall effect region, wherein an electrical resistance between the first and second contacts is substantially equal to an electrical resistance between the third and second contacts; and a conductive layer closer to the second interface than to the first interface and in contact with the Hall effect region, the conductive layer comprising a higher conductivity than the Hall effect region;

wherein a resistance between the fourth contact and the conductive layer is lower than a resistance between the second contact and the conductive layer.

2. The vertical Hall sensor structure according to claim 1, wherein the vertical Hall sensor structure is formed in a substrate with a first main surface, a second main surface and the Hall effect region arranged between the first and second main surfaces, wherein the first main surface is closer to the first and second interfaces than the second main surface.

3. The vertical Hall sensor structure according to claim 1, wherein the first contact and the third contact are substantially equally spaced from the second contact.

4. The vertical Hall sensor structure according to claim 1, wherein the individual contact areas of the first contact and of the third contact on the first interface are substantially equal.

5. The vertical Hall sensor structure according to claim 1, wherein a conductivity of the first and third contacts is substantially identical.

6. The vertical Hall sensor structure according to claim 1, wherein a resistance between the first contact and the fourth contact is substantially equal to a resistance between the third contact and the fourth contact.

7. The vertical Hall sensor structure according to claim 1, wherein a contact area of the fourth contact on the first interface is larger than a contact area on the first interface of any of the first contact, the second contact and the third contact.

8. The vertical Hall sensor structure according to claim 1, further comprising an electrical coupling structure arranged and configured to electrically couple the fourth contact to the buried layer to lower a resistance between the fourth contact and the buried layer compared with a resistance between the second contact and the buried layer.

9. The vertical Hall sensor structure according to claim 8, wherein the electrical coupling structure comprises a well or a trench comprising a material with a higher conductivity than a material comprised in the Hall effect region.

10. The vertical Hall sensor structure according to claim 9, wherein the material comprised in the well or trench comprises at least one of a highly doped semiconductor material and a metal.

11. The vertical Hall sensor structure according to claim 1, further comprising a decoupling structure arranged between the fourth contact and any of the first, second and third contacts to at least partially electrically decouple the fourth contact from the first, second and third contacts.

12. The vertical Hall sensor structure according to claim 11, wherein the decoupling structure comprises a material forming a pn-junction arranged and configured to be operated in a reverse-biased state.

13. The vertical Hall sensor structure according to claim 12, wherein the pn-junction is in contact with the first interface.

14. The vertical Hall sensor structure according to claim 11, wherein the decoupling structure comprises a trench comprising a width along a direction between the fourth contact and any of the first, second and third contacts in a plane equal to or parallel to the main surface of the substrate, the width comprising at least 50% of a smallest distance between the first and second interfaces.

15. A vertical Halls sensor device comprising:
a vertical Hall sensor structure, the vertical Hall sensor structure comprising a Hall effect region arranged between a first interface and a second interface of the Hall effect region, a first contact, a second contact, a third contact, and a fourth contact, the first, second, third and fourth contacts being closer to the first interface than to the second interface and in contact with the Hall effect region, wherein an electrical resistance between the first and second contacts is substantially equal to an electrical resistance between the third and second contacts, and a conductive layer closer to the second interface than to the first interface and in contact with the Hall effect region, the conductive layer comprising a higher conductivity than the Hall effect region, wherein a resistance between the fourth contact and the conductive layer is lower than a resistance between the second contact and the conductive layer.

16. The vertical Hall sensor device according to claim 15, further comprising a second vertical Hall sensor structure, wherein each of the first, second, third and fourth contacts of the second vertical Hall sensor structure is coupled to exactly one contact of the first, second, third and fourth contacts of the second vertical Hall sensor structure during a measurement operation of the vertical Hall sensor device and vice versa.

17. The vertical Hall sensor device according to claim 16, wherein the second contact of the vertical Hall sensor structure is coupled to the fourth contact of the second vertical Hall sensor structure permanently, during all of the measurement operations of the vertical Hall sensor device or during at least one measurement operation of the vertical Hall sensor device.

18. The vertical Hall sensor device according to claim 16, wherein the vertical Hall sensor structure is configured to detect a magnetic field component along a first direction, wherein the second vertical Hall sensor structure is configured to detect a magnetic field component along a second direction, and wherein an angle between the first and second directions is either at most 10° or in a range between 80° and 100°.

19. The vertical Hall sensor device according to claim 15, further comprising a first terminal, a second terminal, a third terminal and a fourth terminal, each terminal of the first, second, third and fourth terminals being coupled to exactly one contact of the first, second, third and fourth contacts of the vertical Hall sensor structure during a measurement operation of the vertical Hall sensor device.

20. A method comprising:
providing electrical energy to a vertical Hall sensor structure in a first phase of operation by a first pair of contacts of the vertical Hall sensor structure comprising a Hall effect region arranged between a first interface and a second interface of the Hall effect region, a first contact, a second contact, a third contact, and a fourth contact, the first, second, third and fourth contacts being closer to the first interface than to the second interface and in contact with the Hall effect region, wherein an electrical resistance between the first and second contacts is substantially equal to an electrical resistance between the third and second contacts, and a conductive layer closer to the second interface than to the first interface and in contact with the Hall effect region, the conductive layer comprising a higher conductivity than the Hall effect region, and wherein a resistance between the fourth contact and the conductive layer is lower than a resistance between the second contact and the conductive layer, wherein the first pair of contacts comprises the first contact and the third contact;
sensing a first magnetic-field sensitive signal at a second pair of contacts during the first phase of operation, wherein the second pair of contacts comprises the second contact and the fourth contact;

providing electrical energy to the vertical Hall sensor structure in a second phase of operation by the second pair of contacts of the vertical Hall sensor structure; and sensing a second magnetic-field sensitive signal at the first pair of contacts during the second phase of operation.

* * * * *

UNITED STATES PATENT AND TRADEMARK OFFICE
CERTIFICATE OF CORRECTION

| | | |
|---|---|---|
| PATENT NO. | : 9,279,864 B2 | Page 1 of 1 |
| APPLICATION NO. | : 14/279509 | |
| DATED | : March 8, 2016 | |
| INVENTOR(S) | : Udo Ausserlechner | |

It is certified that error appears in the above-identified patent and that said Letters Patent is hereby corrected as shown below:

Claims

Column 19, Claim 15, Line 64 Please replace "A vertical Halls sensor device..." with -- A vertical Hall sensor device... --

Signed and Sealed this
Third Day of May, 2016

Michelle K. Lee
*Director of the United States Patent and Trademark Office*